(12) United States Patent
Hung et al.

(10) Patent No.: US 9,746,310 B2
(45) Date of Patent: Aug. 29, 2017

(54) METROLOGY SYSTEM AND MEASUREMENT METHOD USING THE SAME

(71) Applicant: TAIWAN SEMICONDUCTOR MANUFACTURING CO., LTD., Hsinchu (TW)

(72) Inventors: Ying-Chieh Hung, Hsinchu (TW); Yi-Hung Lin, Taipei (TW); Yu-Wei Chou, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 38 days.

(21) Appl. No.: 14/935,006

(22) Filed: Nov. 6, 2015

(65) Prior Publication Data

US 2017/0131084 A1  May 11, 2017

(51) Int. Cl.
| | |
|---|---|
| G01N 21/00 | (2006.01) |
| G01B 11/00 | (2006.01) |
| G01B 11/03 | (2006.01) |
| G01B 15/00 | (2006.01) |

(52) U.S. Cl.
CPC ............ G01B 11/002 (2013.01); G01B 11/03 (2013.01); G01B 15/00 (2013.01)

(58) Field of Classification Search
CPC ........... G01N 21/9501; G01N 21/1717; G01N 21/636; G01N 21/95607
USPC ............................. 356/445–448, 237.1–237.5
See application file for complete search history.

(56) References Cited

U.S. PATENT DOCUMENTS

| | | | | |
|---|---|---|---|---|
| 5,074,669 A | * | 12/1991 | Opsal | G01R 31/308 356/432 |
| 7,060,980 B2 | * | 6/2006 | Nicolaides | G01N 21/171 250/358.1 |
| 7,502,104 B2 | * | 3/2009 | Salnik | G01N 21/1717 356/237.2 |
| 7,660,686 B1 | * | 2/2010 | Nicolaides | G01N 21/1717 356/237.1 |
| 7,755,752 B1 | * | 7/2010 | Salnik | G01N 21/1717 356/237.2 |
| 9,099,495 B1 | * | 8/2015 | Nieh | H01L 29/66803 |
| 2003/0234932 A1 | * | 12/2003 | Nicolaides | G01N 21/1717 356/445 |

* cited by examiner

*Primary Examiner* — Hoa Pham
(74) *Attorney, Agent, or Firm* — Maschoff Brennan

(57) ABSTRACT

A method for measuring an implant dosage distribution of a semiconductor sample is provided. The method includes generating a photomodulation effect in a three-dimensional structure of the semiconductor sample and measuring a reflection information of the three-dimensional structure. A geometry information of the three-dimensional structure of the semiconductor sample is obtained. The geometry information of the three-dimensional structure is converted into an estimated reflective data. The reflection information is compared with the estimated reflective data to determine the implant dosage distribution of the three-dimensional structure of the semiconductor sample.

20 Claims, 4 Drawing Sheets

METROLOGY SYSTEM AND MEASUREMENT METHOD USING THE SAME

BACKGROUND

For many years, devices have existed for evaluating parameters of a semiconductor wafer at various stages during fabrication. Modern materials science is increasingly concerned with the analysis and control of materials at a very small scale. As geometries continue to shrink, manufacturers have increasingly turned to optical techniques to perform non-destructive inspection and analysis of semiconductor wafers. A type of optical inspection and analysis is known as optical metrology and is performed using a range of different optical techniques.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
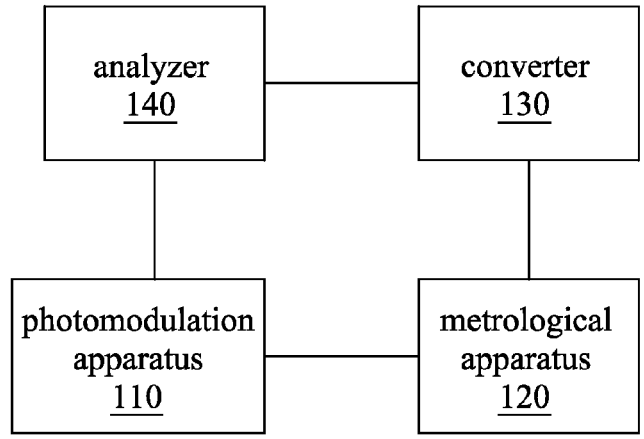
FIG. 1 is a block diagram of a metrology system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide a metrology system and some methods for measuring an implant dosage distribution of a semiconductor sample using the metrology system. These embodiments are discussed below in the context of measuring a fin field effect transistor (finFET) having multiple fins on a bulk silicon substrate. One of ordinary skill in the art will realize that embodiments of the present disclosure may be used with other configurations.

Figure 2:
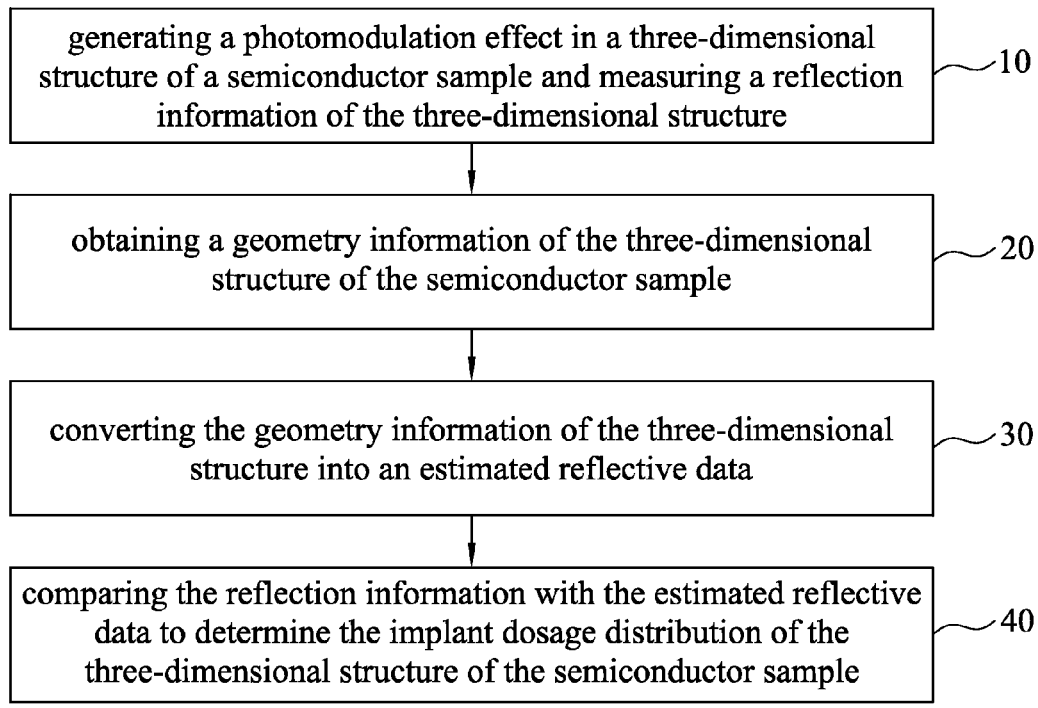
FIG. 2 is a flowchart of a method for measuring an implant dosage distribution of a semiconductor sample in accordance with some embodiments.
Figure 3:
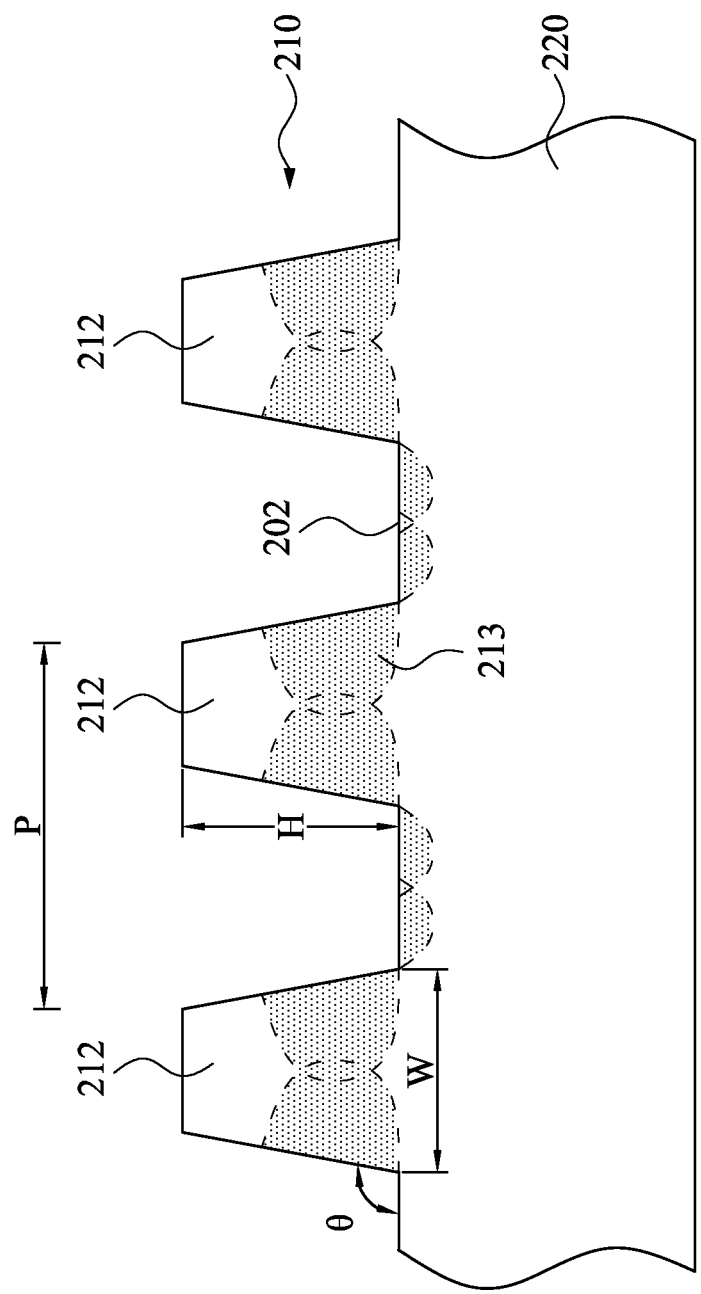
FIG. 3 is a cross-sectional view of a semiconductor sample in accordance with some embodiments.

FIG. 1 is a block diagram of a metrology system 100 in accordance with some embodiments, FIG. 2 is a flowchart of a method for measuring an implant dosage distribution of a semiconductor sample in accordance with some embodiments, and FIG. 3 is a cross-sectional view of a semiconductor sample 200 in accordance with some embodiments. The metrology system 100 can be applied to measure the implant dosage distribution of the semiconductor sample 200. In some embodiments, the semiconductor sample 200 has a three-dimensional structure 210. In some embodiments, the semiconductor sample 200 can be formed to be a semiconductor device including a finFET, and the claimed scope is not limited in this respect.

Reference is made to FIG. 3. The semiconductor sample 200 includes the three-dimensional structure 210. The three-dimensional structure 210 may have trenches, grooves, and/or bumps to form a non-flat surface 202. In some embodiments, the three-dimensional structure 210 may include at least one finFET, which is disposed on a substrate 220. Semiconductor fins 212 of the finFET can be source/drain features thereof. In some embodiments, the semiconductor fins 212 can form a grating structure, and the claimed scope is not limited in this respect. In some embodiments, the substrate 210 is a semiconductor substrate and may include known structures including a graded layer or a buried oxide, for example. For example, the substrate 220 is a silicon substrate. Other materials, such as germanium, quartz, sapphire, and glass could alternatively be used for the substrate 220. The semiconductor fins 212 may be made of silicon or other suitable semiconductor materials.

The semiconductor fins 212 may be formed, for example, by patterning and etching the substrate 220 using photolithography techniques. In some embodiments, a layer of photoresist material (not shown) is deposited over the substrate 220. The layer of photoresist material is irradiated (exposed) in accordance with a desired pattern (the semiconductor fins 210 in this case) and developed to remove a portion of the photoresist material. The remaining photoresist material protects the underlying material from subsequent processing steps, such as etching. It is noted that other masks, such as an oxide or silicon nitride mask, may also be used in the etching process.

A plurality of implantation regions 213 are formed in the semiconductor fins 212 and/or the substrate 220. Dopants as ions are implanted to the semiconductor sample 200 during a process known as ion implantation. In some ion implantation processes, an ion beam is rastered over the surface 202 of the semiconductor sample 202. Some of the ions in the ion beam are introduced into the lattice structure of the semiconductor sample 200. The duration and intensity of the ion implantation process (i.e., total exposure of the semiconductor sample) controls the resulting dopant concentration. The ion energy used during the implantation process controls the depth of implant. Both concentration and depth are factors that determine the overall effectiveness of the ion implantation process. The implantation regions 213 may be disposed on the sidewall of the semiconductor fins 212, inside of the semiconductor fins 212, and/or between the semiconductor fins 212. The implant dosage distribution may be spatially varied. For an n-type finFET, the implantation regions 213 can be doped with n-type dopants, such as phosphorus (P) or arsenic (As). For a p-type finFET, the implantation regions 213 can be doped with p-type dopants, such as boron (B), and the claimed scope is not limited in this respect.

Reference is made to FIGS. 1 and 3. The metrology system 100 is configured to measure the implant dosage distribution of the semiconductor sample 200. The metrology system 100 includes a photomodulation apparatus 110, a metrological apparatus 120, a converter 130, and an analyzer 140. The photomodulation apparatus 110 is configured to generate a photomodulation effect in the three-dimensional structure 210 of the semiconductor sample 200 and measure reflection information of the three-dimensional structure 210. The metrological apparatus 120 is configured to obtain geometry information of the three-dimensional structure 210 of the semiconductor sample. The converter 130 is configured to convert the geometry information of the three-dimensional structure 210 into an estimated reflective data. The analyzer 140 is configured to compare the reflection information with the estimated reflective data to determine the implant dosage distribution of the three-dimensional structure 210 of the semiconductor sample 200.

Figure 4:
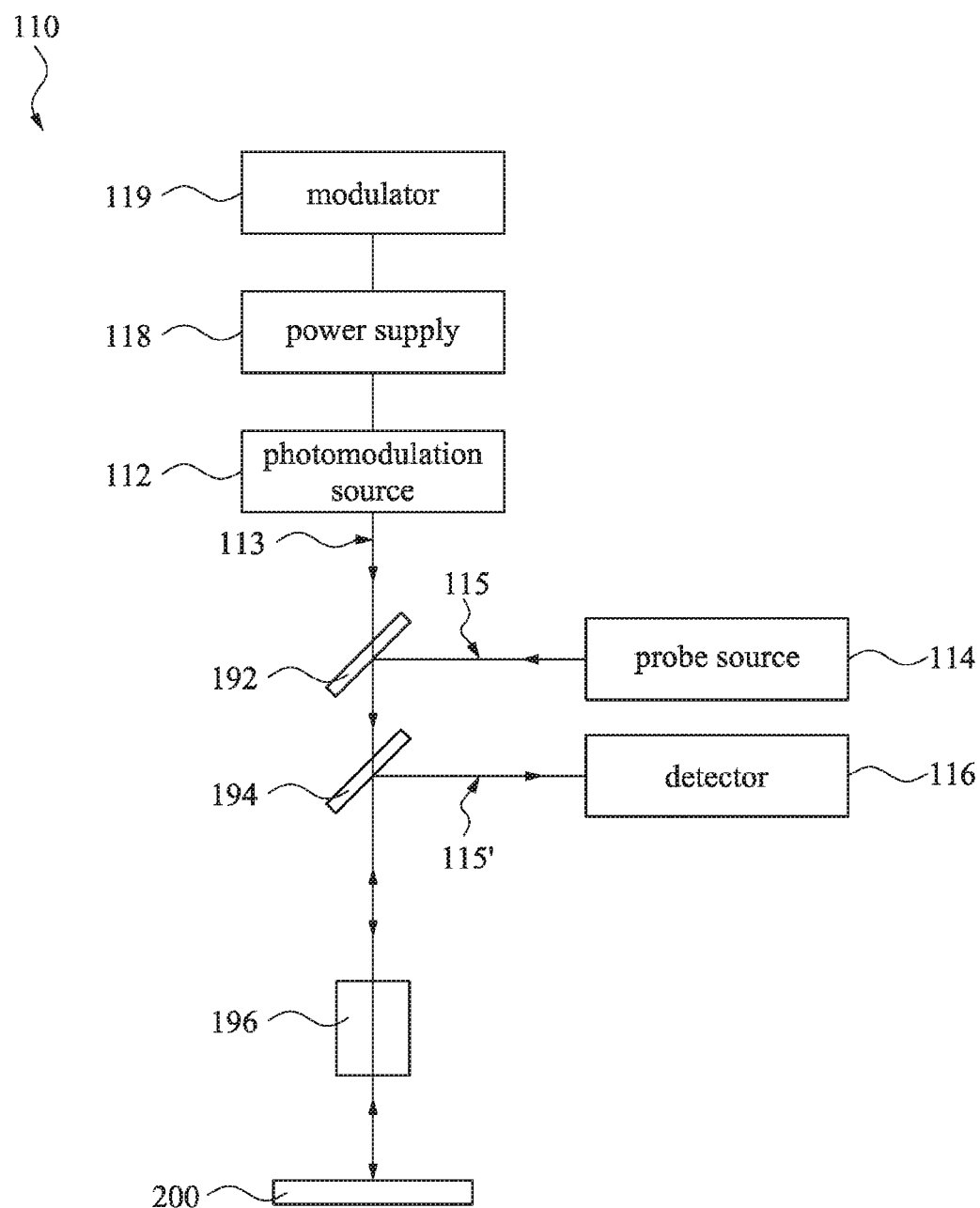
FIG. 4 is a schematic diagram of the photomodulation apparatus of FIG. 1 in accordance with some embodiments.
Figure 5:
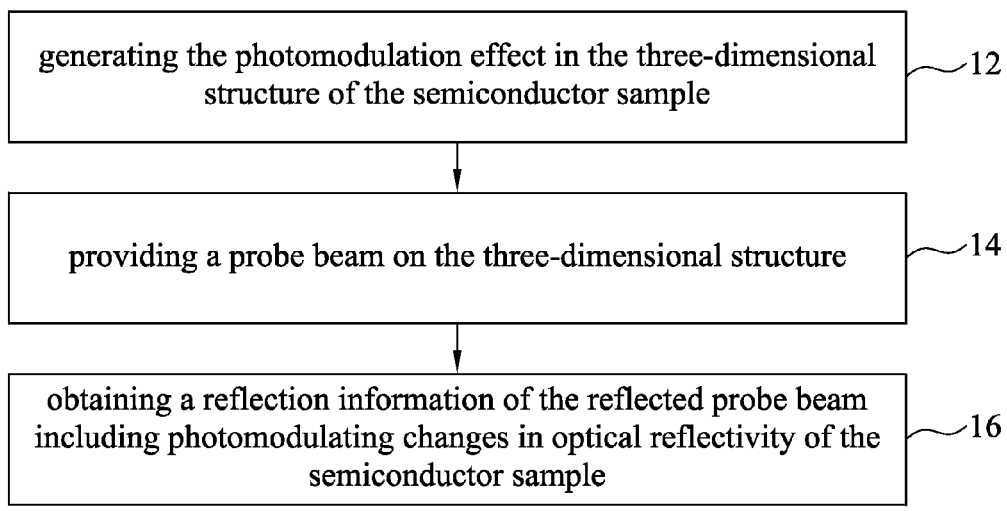
FIG. 5 is a flowchart of the operation 10 of FIG. 2 in accordance with some embodiments.

Reference is made to FIGS. 1 and 2. At operation 10, a modulated photomodulation effect is generated in the three-dimensional structure 210 (see FIG. 3) of the semiconductor sample 200, and the reflection information of the three-dimensional structure 210 is measured. In greater detail, reference is made to FIGS. 4 and 5, where FIG. 4 is a schematic diagram of the photomodulation apparatus 110 of FIG. 1 in accordance with some embodiments, and FIG. 5 is a flowchart of the operation 10 of FIG. 2 in accordance with some embodiments. The photomodulation apparatus 110 includes a photomodulation source 112, a probe source 114, and a detector 116. The photomodulation source 112 is configured to generate the photomodulation effect in the three-dimensional structure 210 (see FIG. 3) of the semiconductor sample 200. The probe source 114 is configured to provide a probe beam 115 on the three-dimensional structure 210. The detector 116 is configured to detect the reflected probe beam 115 to obtain the reflection information including modulating changes in optical reflectivity of the semiconductor sample 200 induced by the photomodulation effect. The photomodulation apparatus 110 can obtain the reflection information in a non-destructive and non-contact manner.

At operation 12, the photomodulation effect is generated in the three-dimensional structure 210 of the semiconductor sample 200. In other words, the three-dimensional structure 210 of the semiconductor sample 200 is (periodically) photomodulated. The photomodulation source 112 can be a pump laser. Gas, solid state, or semiconductor lasers can be used. Other photomodulation sources for exciting the semiconductor sample 200 can include different sources of electromagnetic radiations or particle beams such as from an electron gun. In some embodiments, the photomodulation effect is periodic waves periodically exciting (or heating) the three-dimensional structure 210.

In some embodiments, the photomodulation source 112 can generate a pump beam 113, where the pump beam 113 may have visible, near infrared, or infrared wavelength. The pump beam 113 of the photomodulation source 112 can be linearly polarized. The pump beam 113 passes through dichroic mirrors 192 and 194 and impinges on the semiconductor sample 200.

In some embodiments, after passing through the dichroic mirrors 192 and 194, the pump beam 113 is directed down to the semiconductor sample 200 through an objective 196. The objective 196 may be a microscope objective and has a high numerical aperture (N.A.), and is capable of focusing the pump beam 113 to a spot size on the order of a few microns and suitably close to one micron in diameter. In some embodiments, the spacing between the objective 196 and the semiconductive sample 200 can be controlled by an autofocus system (not shown herein).

The photomodulation source 112 is connected to a power supply 118 which is under control of a modulator 119. The pump beam 113 of the photomodulation source 112 is intensity modulated through the output of power supply 128. The modulation frequency may be in a range of 100 KHz to 100 MHz. In some embodiments, the modulation frequency can be set up to 125 MHz. If an ion laser, such as an argon ion layer, is used to generate the pump beam 113, the intensity modulation can be achieved by a separate acousto-optic modulator (not shown).

When the semiconductor sample 200 is illuminated with the pump beam 113, electrons in the valence band absorb the incident energy and cross the forbidden energy gap toward the conduction band, leaving an equal number of holes behind in the valence band. On a picosecond time scale, electrons and holes become photomodulated with the lattice through phonon emitting, releasing the excess energy, and end up at the bottom of the conduction band for the electrons and the top of the valence band for the holes. Following photoexcitation the carriers will diffuse to the lattice and eventually recombine and transfer their energy to the semiconductor sample 200. When the illumination of the semiconductor sample 200 is harmonically modulated, wave like solution to the plasma (electron and hole combination) diffusion equation exists, known as plasma waves traveling in the semiconductor sample 200. The recombination mechanism of relaxation have as a consequence the rise of local temperature of the semiconductor sample 200. Since the pump beam 113 is modulated, photomodulation effect (or plasma waves) are generated from the semiconductor sample 200. In some embodiments, the pump beam 113 is periodic, so the semiconductor sample 200 is periodically photomodulated and generates periodic plasma waves.

In accordance with the principle mentioned above, the plasma waves generated from the ion-implanted semiconductor sample 200 are absorbed into the semiconductor sample 200. The ion-implanted semiconductor sample 200 has amorphous phase due to the damage caused by an ion implantation process. The amorphous phased ion-implanted semiconductor sample serves as the main source of the plasma wave absorbance. Since the implant dosage of the semiconductor sample 200 is spatially varied, the plasma wave absorbance is also spatially varied.

The plasma waves have effects on the reflectivity of the surface 202 (see FIG. 3) of the semiconductor sample 200. Features and/or regions below the surface 202 that alter the passage of the plasma waves will therefore alter the optical reflective patterns at the surface 202 of the semiconductor sample 200. By measuring (or obtaining) the changes in reflectivity of the semiconductor sample 200 at the surface 202, information about characteristics below the surface 202 can be investigated. That is, the reflection information changes appearing at the surface 202 are due to the temperature rise or to the plasma at the damaged layer (i.e., the implantation regions 213).

At operation 14, a probe beam 115 is provided on the three-dimensional structure 210 of the semiconductor sample 200. The probe source 114 of FIG. 4 provides the probe beam 115. The probe source 114 can be a laser. Gas, solid state, or semiconductor lasers can be used. For example, the probe source 114 can be a helium-neon (He—Ne) laser. In some embodiments, the probe beam 115 may have visible, near infrared, or infrared wavelength. The probe beam 115 of the probe source 114 can be linearly polarized. The pump beam 113 and the probe beam 115 have different wavelengths. Hence, the probe beam 115 impinges on the dichroic mirror 192 is reflected by the dichroic mirror 192. Therefore, the pump beam 113 and the probe beam 115 can be combined, i.e., the pump beam 113 and the probe beam 115 are collinear. After passing through the dichroic mirror 192, the probe beam 115 passes through the dichroic mirror 194 and the objective 196 and impinges on the semiconductor sample 200. In some embodiments, the pump beam 113 and the probe beam 115 are focused at substantially the same spot on the surface 202 of the semiconductor sample 200. By focusing the pump beam 113 and the probe beam 115 at substantially the same spot, high signal output intensity can be achieved.

It is to be understood that the reflectivity signals of interest exist at any area on the surface 202 of the semiconductor sample 200 which has been periodically photomodulated by the pump beam 113. Therefore, the probe beam 115 would not have to be directly coincident with the pump beam 113 to detect the signals of interest. Accordingly, the objective 196 is not necessary for focusing either the pump beam 113 or the probe beam 115. Rather, it can direct the probe beam 115 within at least a portion of the periodically photomodulated area of the semiconductor sample 200.

At operation 16, the reflection information of the reflected probe beam 115' is detected (or obtained) by the detector 116. The reflected probe beam 115' results from the modulating (or periodically) changes in optical reflectivity of the semiconductor sample 200 induced by the modulated pump beam. In greater detail, the reflected probe beam 115' impinges on the dichroic mirror 194 and then reflects to the detector 116. In some embodiments, a filter (not shown) is provided to block pump beam 113 from reaching the detector 116. The detector 116 provides output signals which are proportional to the powers of the reflected probe beam 115'. The detector 116 can be arranged to be underfilled so that its output can be insensitive to different changes in beam diameter or position. In some embodiments, the detector 116 is a quad cell generating four separate outputs. When used to measure a reflected beam power, the output of all four quadrants are summed. In some other embodiments, the detector 116 can measure the deflection of the reflected probe beam 115'. In these cases, the output of one adjacent pair of quadrants is summed and subtracted from the sum of the remaining pair of quadrants.

The change in reflectivity of the reflected probe beam 115' depends on the dielectric property variation of the semiconductor sample 200. As mentioned above, since the pump beam 113 is modulated (or periodic in some embodiments), the dielectric property of the surface 202 (see FIG. 3) oscillations. Further, the ion implantation of the implantation regions 213 (see FIG. 3) affects the absorption of the plasma waves. Hence, the reflection information of the reflected probe beam 115' depends on the dielectric property variation of the surface 202. Therefore, the reflection information at least includes the implant dosage distribution and the dielectric property of the three-dimensional structure 210 of the semiconductor sample 200.

Furthermore, the geometry of the three-dimensional structure 210 (see FIG. 3) also affects the reflection information. For example, if the semiconductor fins 212 form a grating structure, the reflectivity of the probe beam 115 further depends on the profile of the grating. In greater detail, the grating can split and diffract the probe beam 115 into several beams traveling in different directions. The directions of these beams depend on the spacing of the grating and the wavelength of the light so that the grating acts as the dispersive element. These beams also can form constructive and/or destructive interference to affect the reflectivity of the reflected probe beam 115. Therefore, the reflection information is associated with the implant dosage concentrations of the implantation regions 213, the dielectric property of the surface 202, and the geometry of the three-dimensional structure 210.

It is noted that the optical configurations in FIG. 4 (i.e., the dichroic mirrors 192 and 194 and the objective 196) are illustrative, and should not limit the claimed scope. A person having ordinary skill in the art may design a suitable optical configuration of the thermal-wave apparatus 110 according to actual situations.

The implant dosage distribution of the semiconductor sample 200 can be extracted from the reflection information. In greater detail, reference is made to FIGS. 1 and 2. At operation 20, a geometry information of the three-dimensional structure 210 of the semiconductor sample 200 (see FIG. 3) is obtained (or measured) by the metrological apparatus 120. In some embodiments, the metrological apparatus 120 can obtain the geometry information in a non-destructive and non-contact manner. For the semiconductor sample 200 in FIG. 3, the geometry information is the profile of the semiconductor fins 212. For example, the geometry information includes the width W and the height H of the semiconductor fins 212, the pitch P between adjacent two of the semiconductor fins 212, the angle θ formed between the sidewall of the semiconductor fins 212 and the substrate 220, etc. In some embodiments, the metrological apparatus 120 is more sensitive to the geometry of the three-dimensional structure 210 of the semiconductor sample 200 than the implant dosage distribution thereof.

In some embodiments, the metrological apparatus 120 can be an optical critical dimension (OCD) metrology (or called scatterometry). Optical critical dimension measurement is a measurement and characterization of light diffracted from periodic structures. The scattered or diffracted light pattern, often referred to as a signature, can be used to characterize the details of the structure shape. Due to complex interactions between the incident light and the material of the structure, the fraction of incident power diffracted into any order is sensitive to the shape and dimensional parameters of the structure and may be used to characterize the structure. In addition to the period (i.e., the pitch P) of the structure, the height H, the width W, the angle θ, and other parameters can be measured by analyzing the scatter pattern.

In some embodiments, the metrological apparatus 120 can be a scanning electron microscope (SEM) or a critical dimensional scanning electron microscope (CD-SEM). The principle of the CD-SEM is to automatically introduce a wafer (for example, the semiconductor sample 200 in FIG. 1) in a vacuum chamber and observe patterns from the top. Due to this non-destructive method, CD-SEM is compatible with the production environment and with an in-line fabrication process control. In a microelectronic production environment, CD-SEM usually works between about 300 V to about 1000 V. For lithography applications, working voltage can be between about 300 V and about 500 V. With CD-SEM, measurement is fully automated, hence reducing operator errors. It uses a recognition pattern to locate the patterns to be measured and to position the system repeatedly. It also has automated autofocus. Its beam controlling system is stable so as to reduce measurement errors. The electromagnetic field created has a lower energy hence reducing pattern deterioration and limiting charging phenomenon. Image distortion is then often reduced and good quality images can be obtained, especially with low atomic number elements and when working with silicon or photosensitive resists.

In some embodiments, the operation 10 can be performed before the operation 20. That is, the reflection information is obtained before the estimated reflective data is obtained. In some other embodiments, the operation 10 can be performed after the operation 20. That is, the reflection information is obtained after the estimated reflective data is obtained.

At operation 30, the geometry information of the three-dimensional structure is converted into an estimated reflective data by the converter 130. In other words, the estimated reflective data is determined based on the geometry information. The term of "estimated" as used herein means the reflective data is indirectly obtained from the measurement result of the metrological apparatus 120. That is, the estimated reflective data is calculated or simulated from the geometry information obtained from the metrological apparatus 120.

In some embodiments, the estimated reflective data is converted by using Rigorous Coupled-Wave Analyze (RCWA) method. In other words, the converter 130 is an RCWA processor. Rigorous Coupled-Wave Analyze (RCWA) is a mathematical mechanism that allows for the solution of the electromagnetic fields diffracted by a periodic structure, for example, a grating. It is based on Maxwell's equations, which are used in a variety of optical inspection techniques, most notably ellipsometers for the measurement of thin films. By utilizing Maxwell's equations in vector differential form, and by applying boundary conditions at interfaces, RCWA calculates the field strength in different regions of the periodic structure. The method is based on the Floquet's theorem that the solutions of periodic differential equations can be expanded with Floquet functions (or sometimes referred as Bloch wave).

In greater detail, a rectangular form of a grating allows in RCWA a separation of space variables, and, using Fourier expansions for the space periodic part of the solution, a transformation of the problem described by the partial differential equations into the system of ordinary differential equations (ODE) for the Fourier amplitudes. In order to solve the problem numerically, the infinite dimensional continuous problem can be discretized. In RCWA, this entails the truncation of the Fourier expansions, followed by a derivation of the finite dimensional representation of the problem. The solution of the resulting ODEs can be written in the form of elementary matrix functions with an elegant matrix formulation of the linear algebraic problems for the integrating constants.

In some embodiments, the estimated reflective data is further calculated considering the photomodulation effect of the modulated beam. More specifically, the estimated reflective data is further calculated according to the thermal-plasma coupling effect. For example, when a sample of semiconductor material is illuminated, pairs of excess carriers are generated. The carries may diffuse through the material according to the density gradients established. The pairs of the carries respectively carry energies each of which approximately equal to the band gap of the material. This energy is deposited where the excess electron recombines with a hole and causes local photomodulating of the lattice. A dielectric property distribution will therefore be established in the sample which depends on the characteristics of optical absorption of the sample and surface recombination in and on the sample. This establishment of a dielectric property distribution in a solid by optically excited diffusing and recombining carriers is called the photomodulation effect.

By including the photomodulation effect, the geometry information can be converted into the estimated reflective data with RCWA method. Therefore, the estimated reflective data is associated with the dielectric property of the surface 202 (see FIG. 3) and the geometry of the three-dimensional structure 210 (see FIG. 3).

Reference is made to FIGS. 1 and 2. At operation 40, the reflection information is compared with the estimated reflective data to determine the implant dosage distribution of the three-dimensional structure of the semiconductor sample. That is, the implant dosage distribution is determined based on the reflection information and the estimated reflective data. In some embodiments, the analyzer 140 is used to compare the reflection information with the estimated reflective data.

Figure 6:
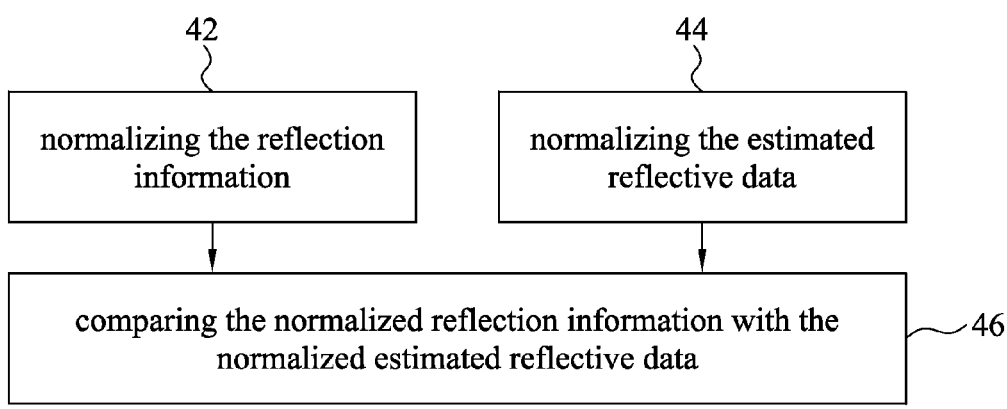
FIG. 6 is a flowchart of the operation 40 of FIG. 2 in accordance with some embodiments.

FIG. 6 is a flowchart of the operation 40 of FIG. 2 in accordance with some embodiments. At operation 42, the reflection information is normalized. Since the range of values of raw data varies widely, in some machine learning algorithms, objective functions will not work properly without normalization. Therefore, the reflection information can be normalized (or rescaled). Also, at operation 44, the estimated reflective data is normalized. Then, at operation 46, both the normalized reflection information and the normalized estimated reflective data are compared. Since the (normalized) reflection information is associated with the implant dosage concentrations of the implantation regions, the dielectric property of the surface of the three-dimensional structure, and the geometry of the three-dimensional structure, and the (normalized) estimated reflective data is associated with the dielectric property of the surface of the three-dimensional structure and the geometry of the three-dimensional structure, the implant dosage distribution of the three-dimensional structure 210 (see FIG. 3) can be extracted from the (normalized) reflection information.

According to the aforementioned embodiments, the metrology system the measuring method can measure the implant dosage distribution of the three-dimensional structure of the semiconductor sample in a non-destructive and non-contact manner. In greater detail, the photomodulation apparatus of the metrology system can obtain the reflection information of the three-dimensional structure. The reflection information is associated with the implant dosage concentrations of the implantation regions, the dielectric property of the surface of the three-dimensional structure, and the geometry of the three-dimensional structure. The metrological apparatus can obtain the geometry information of the three-dimensional structure. The geometry information is then converted into the estimated reflective data. By comparing the estimated reflective data with the reflection information, the implant dosage distribution of the three-dimensional structure can be obtained.

According to some embodiments, a method for measuring an implant dosage distribution of a semiconductor sample is provided. The method includes generating a photomodulation effect in a three-dimensional structure of the semiconductor sample and measuring a reflection information of the three-dimensional structure. A geometry information of the three-dimensional structure of the semiconductor sample is obtained. The geometry information of the three-dimensional structure is converted into an estimated reflective data. The reflection information is compared with the estimated reflective data to determine the implant dosage distribution of the three-dimensional structure of the semiconductor sample.

According to some embodiments, a method for measuring an implant dosage distribution of a semiconductor sample is provided. The method includes photomodulating a grating structure of the semiconductor sample. A probe beam is provided on the grating structure. The reflection information of the reflected probe beam is obtained. The reflection information includes the photomodulating changes in optical reflectivity of the semiconductor sample. A geometry information of the grating structure of the semiconductor sample is measured. An estimated reflective data is determined based on the geometry information. The implant dosage distribution of the grating structure of the semiconductor sample is determined based on the reflection information and the estimated reflective data.

According to some embodiments, a metrology system for measuring an implant dosage distribution of a semiconductor sample is provided. The metrology system includes a photomodulation apparatus, a metrological apparatus, a converter, and an analyzer. The photomodulation apparatus is configured to generate a photomodulation effect in a three-dimensional structure of the semiconductor sample and measure reflection information of the three-dimensional structure. The metrological apparatus is configured to obtain geometry information of the three-dimensional structure of the semiconductor sample. The converter is configured to convert the geometry information of the three-dimensional structure into an estimated reflective data. The analyzer is configured to compare the reflection information with the estimated reflective data to determine the implant dosage distribution of the three-dimensional structure of the semiconductor sample.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for measuring an implant dosage distribution of a semiconductor sample, the method comprising:
    generating a photomodulation effect in a three-dimensional structure of the semiconductor sample and measuring a reflection information of the three-dimensional structure;
    obtaining a geometry information of the three-dimensional structure of the semiconductor sample by a metrological apparatus;
    converting the geometry information of the three-dimensional structure into an estimated reflective data by a converter; and
    comparing the reflection information with the estimated reflective data by an analyzer to determine the implant dosage distribution of the three-dimensional structure of the semiconductor sample.

2. The method of claim 1, wherein the converting comprises:
    calculating the estimated reflective data according to the geometry information.

3. The method of claim 2, wherein the estimated reflective data is calculated further considering the photomodulation effect.

4. The method of claim 1, wherein the estimated reflective data is converted by using a Rigorous Coupled-Wave Analyze (RCWA) method.

5. The method of claim 1, wherein the three-dimensional structure comprises a plurality of semiconductor fins.

6. The method of claim 5, wherein the geometry information is a profile of the semiconductor fins.

7. A method for measuring an implant dosage distribution of a semiconductor sample, the method comprising:
    photomodulating a grating structure of the semiconductor sample;
    providing a probe beam on the grating structure of the semiconductor sample;
    obtaining a reflection information of the reflected probe beam including photomodulating changes in optical reflectivity of the semiconductor sample;
    measuring a geometry information of the grating structure of the semiconductor sample by a metrological apparatus;
    determining an estimated reflective data based on the geometry information by a converter; and
    determining the implant dosage distribution of the grating structure of the semiconductor sample based on the reflection information and the estimated reflective data by an analyzer.

8. The method of claim 7, wherein the determining the implant dosage distribution of the grating structure of the semiconductor sample comprises:
    normalizing the estimated reflective data.

9. The method of claim 7, wherein the determining the implant dosage distribution of the grating structure of the semiconductor sample comprises:
    normalizing the reflection information.

10. The method of claim 7, wherein the photomodulating is performed by emitting a laser beam on the grating structure of the semiconductor sample.

11. The method of claim 10, wherein the laser beam and the probe beam have different wavelengths.

12. The method of claim 7, wherein the determining the estimated reflective data comprises:
    simulating a reflectivity of the grating structure of the semiconductor sample based on the geometry information.

13. The method of claim 12, wherein the reflectivity of the grating structure of the semiconductor sample is simulated further considering the photomodulating.

14. A metrology system for measuring an implant dosage distribution of a semiconductor sample, the metrology system comprising:
    a photomodulation apparatus configured to generate a photomodulation effect in a three-dimensional structure of the semiconductor sample and measure a reflection information of the three-dimensional structure;
    a metrological apparatus configured to obtain a geometry information of the three-dimensional structure of the semiconductor sample;

a converter configured to convert the geometry information of the three-dimensional structure into an estimated reflective data; and an analyzer configured to compare the reflection information with the estimated reflective data to determine the implant dosage distribution of the three-dimensional structure of the semiconductor sample.

15. The metrology system of claim 14, wherein the converter is a Rigorous Coupled-Wave Analyze (RCWA) processor.

16. The metrology system of claim 14, wherein the photomodulation apparatus comprises:

a photomodulation source configured to generate the photomodulation effect in the three-dimensional structure of the semiconductor sample;

a probe source configured to provide a probe beam on the three-dimensional structure; and a detector configured to detect the reflected probe beam to obtain the reflection information including modulating changes in optical reflectivity of the semiconductor sample induced by the photomodulation effect.

17. The metrology system of claim 16, wherein the photomodulation source comprises:

a light source configured to provide a pump beam; and a modulator configured to modulate the pump beam into a modulated pump beam and direct the modulated pump beam to impinge on the three-dimensional structure of the semiconductor sample to generate the photomodulation effect.

18. The metrology system of claim 16, wherein the probe source is a laser.

19. The metrology system of claim 14, wherein the metrological apparatus is an optical critical dimension metrology.

20. The metrology system of claim 14, wherein the metrological apparatus is a scanning electron microscope.

* * * * *